US011664357B2

(12) United States Patent
Fountain, Jr. et al.

(10) Patent No.: US 11,664,357 B2
(45) Date of Patent: May 30, 2023

(54) TECHNIQUES FOR JOINING DISSIMILAR MATERIALS IN MICROELECTRONICS

(71) Applicant: ADEIA SEMICONDUCTOR BONDING TECHNOLOGIES INC., San Jose, CA (US)

(72) Inventors: Gaius Gillman Fountain, Jr., Youngsville, NC (US); Chandrasekhar Mandalapu, Morrisville, NC (US); Laura Wills Mirkarimi, Sunol, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 16/459,610

(22) Filed: Jul. 2, 2019

(65) Prior Publication Data

US 2020/0013765 A1 Jan. 9, 2020

Related U.S. Application Data

(60) Provisional application No. 62/693,671, filed on Jul. 3, 2018.

(51) Int. Cl.
*H01L 21/762* (2006.01)
*H01L 21/20* (2006.01)
(Continued)

(52) U.S. Cl.
CPC ........ *H01L 25/162* (2013.01); *H01L 21/4803* (2013.01); *H01L 23/14* (2013.01)

(58) Field of Classification Search
CPC ......... H01L 21/76251; H01L 21/76275; H01L 21/2007
See application file for complete search history.

(56) References Cited

U.S. PATENT DOCUMENTS 3,175,025 A  3/1965  Geen et al.
3,423,823 A  1/1969  Ansley
(Continued)

FOREIGN PATENT DOCUMENTS

AU  2002320030 A1  2/2003
EP     0823780 A1  2/1998
(Continued)

OTHER PUBLICATIONS

Takei et al., "Effects of Wafer Precleaning and Plasma Irradiation to Wafer Surfaces on Plasma-Assisted Surface-Activated Direct Bonding", Japanese Journal of Applied Physics, 49 (2010): pp. 1-3 (Year: 2010).*

(Continued)

*Primary Examiner* — Michele Fan
(74) *Attorney, Agent, or Firm* — Knobbe Martens Olson & Bear, LLP

(57) ABSTRACT

Techniques for joining dissimilar materials in microelectronics are provided. Example techniques direct-bond dissimilar materials at an ambient room temperature, using a thin oxide, carbide, nitride, carbonitride, or oxynitride intermediary with a thickness between 100-1000 nanometers. The intermediary may comprise silicon. The dissimilar materials may have significantly different coefficients of thermal expansion (CTEs) and/or significantly different crystal-lattice unit cell geometries or dimensions, conventionally resulting in too much strain to make direct-bonding feasible. A curing period at ambient room temperature after the direct bonding of dissimilar materials allows direct bonds to strengthen by over 200%. A relatively low temperature anneal applied slowly at a rate of 1° C. temperature increase per minute, or less, further strengthens and consolidates the direct bonds. The example techniques can direct-bond lithium tantalate LiTaO$_3$ to various conventional (Continued)

substrates in a process for making various novel optical and acoustic devices.

19 Claims, 9 Drawing Sheets

(51) Int. Cl.
  *H01L 25/16* (2023.01)
  *H01L 21/48* (2006.01)
  *H01L 23/14* (2006.01)

(56) References Cited

U.S. PATENT DOCUMENTS

| | | | |
|---|---|---|---|
| 4,612,083 A | 9/1986 | Yasumoto et al. | |
| 4,818,728 A | 4/1989 | Rai et al. | |
| 5,451,547 A | 9/1995 | Himi et al. | |
| 5,668,057 A | 9/1997 | Eda et al. | |
| 5,747,857 A | 5/1998 | Eda et al. | |
| 5,753,536 A | 5/1998 | Sugiyama et al. | |
| 5,771,555 A | 6/1998 | Eda et al. | |
| 6,080,640 A | 6/2000 | Gardner et al. | |
| 6,180,496 B1 | 1/2001 | Farrens et al. | |
| 6,423,640 B1 | 7/2002 | Lee et al. | |
| 6,465,892 B1 | 10/2002 | Suga | |
| 6,495,398 B1 | 12/2002 | Goetz | |
| 6,502,271 B1* | 1/2003 | Epshteyn | B08B 1/04 15/77 |
| 6,645,828 B1 | 11/2003 | Farrens et al. | |
| 6,877,209 B1 | 4/2005 | Miller et al. | |
| 6,887,769 B2 | 5/2005 | Kellar et al. | |
| 6,908,027 B2 | 6/2005 | Tolchinsky et al. | |
| 6,908,832 B2 | 6/2005 | Farrens et al. | |
| 7,037,804 B2 | 5/2006 | Kellar et al. | |
| 7,045,453 B2 | 5/2006 | Canaperi et al. | |
| 7,105,980 B2 | 9/2006 | Abbott et al. | |
| 7,109,092 B2 | 9/2006 | Tong | |
| 7,126,212 B2 | 10/2006 | Enquist et al. | |
| 7,192,841 B2 | 3/2007 | Wei et al. | |
| 7,193,423 B1 | 3/2007 | Dalton et al. | |
| 7,213,314 B2 | 5/2007 | Abbott et al. | |
| 7,230,512 B1 | 6/2007 | Carpenter et al. | |
| 7,335,572 B2 | 2/2008 | Tong et al. | |
| 7,466,022 B2 | 12/2008 | Miller et al. | |
| 7,602,070 B2 | 10/2009 | Tong et al. | |
| 7,750,488 B2 | 7/2010 | Patti et al. | |
| 7,803,693 B2 | 9/2010 | Trezza | |
| 8,035,464 B1 | 10/2011 | Abbott et al. | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,735,219 B2 | 5/2014 | Enquist et al. | |
| 8,802,538 B1 | 8/2014 | Liu | |
| 8,809,123 B2 | 8/2014 | Liu et al. | |
| 8,975,158 B2 | 3/2015 | Plach et al. | |
| 8,988,299 B2 | 3/2015 | Kam et al. | |
| 9,093,350 B2 | 7/2015 | Endo et al. | |
| 9,142,517 B2 | 9/2015 | Liu | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,698,126 B2 | 7/2017 | Enquist et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,960,142 B2 | 5/2018 | Chen et al. | |
| 10,002,844 B1 | 6/2018 | Wang et al. | |
| 10,026,605 B2 | 7/2018 | Doub et al. | |
| 9,953,941 B2 | 8/2018 | Enquist | |
| 10,075,657 B2 | 9/2018 | Fahim et al. | |
| 10,177,735 B2 | 1/2019 | Ruby et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,454,447 B2 | 10/2019 | Solal et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,727,219 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |
| 11,171,117 B2 | 11/2021 | Gao et al. | |
| 11,176,450 B2 | 11/2021 | Teig et al. | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 2001/0037995 A1* | 11/2001 | Akatsu | C04B 41/009 216/100 |
| 2002/0030198 A1 | 3/2002 | Coman et al. | |
| 2002/0048900 A1 | 4/2002 | Lo et al. | |

(56) References Cited

U.S. PATENT DOCUMENTS

| | | |
|---|---|---|
| 2002/0068396 A1 | 6/2002 | Fitzergald |
| 2003/0022412 A1 | 1/2003 | Higgins et al. |
| 2003/0030119 A1 | 2/2003 | Higgins, Jr. et al. |
| 2004/0084414 A1 | 5/2004 | Sakai et al. |
| 2006/0057945 A1 | 3/2006 | Hsu et al. |
| 2006/0076559 A1 | 4/2006 | Faure et al. |
| 2006/0121696 A1 | 6/2006 | Shiota et al. |
| 2006/0138907 A1* | 6/2006 | Koizumi ............ H01L 41/273 419/48 |
| 2006/0199353 A1 | 9/2006 | Kub et al. |
| 2006/0255341 A1 | 11/2006 | Pinnington et al. |
| 2006/0273068 A1 | 12/2006 | Tussot et al. |
| 2006/0284167 A1* | 12/2006 | Augustine .......... H01L 21/2007 257/40 |
| 2007/0096294 A1 | 5/2007 | Ikeda et al. |
| 2007/0111386 A1 | 5/2007 | Kim et al. |
| 2007/0222048 A1 | 9/2007 | Huang |
| 2007/0295456 A1 | 12/2007 | Gudeman et al. |
| 2009/0004822 A1 | 1/2009 | Murakami et al. |
| 2009/0042356 A1 | 2/2009 | Takayama et al. |
| 2009/0068831 A1 | 3/2009 | Enquist et al. |
| 2009/0191719 A1 | 7/2009 | Dupont |
| 2009/0321869 A1* | 12/2009 | Fukuoka ............ H01L 27/14603 257/461 |
| 2011/0053339 A1* | 3/2011 | Ozawa ............... H01L 21/76224 438/424 |
| 2011/0128399 A1 | 6/2011 | Fujii |
| 2011/0290552 A1 | 12/2011 | Palmateer et al. |
| 2012/0003813 A1 | 1/2012 | Chuang et al. |
| 2012/0028440 A1 | 2/2012 | Castex et al. |
| 2012/0077329 A1* | 3/2012 | Broekaart ............ H01L 24/80 438/455 |
| 2012/0119224 A1 | 5/2012 | Tai et al. |
| 2012/0168792 A1 | 7/2012 | Kang et al. |
| 2012/0183808 A1 | 7/2012 | Tong |
| 2012/0212384 A1 | 8/2012 | Kam et al. |
| 2012/0270231 A1* | 10/2012 | Smith .................. C09K 11/02 435/7.1 |
| 2013/0130473 A1* | 5/2013 | Ben Mohamed ..... H01L 21/762 438/458 |
| 2013/0228775 A1* | 9/2013 | Noda .................. H01L 29/7869 257/43 |
| 2014/0167230 A1* | 6/2014 | Kitada ............... H01L 21/76262 257/650 |
| 2014/0175655 A1 | 6/2014 | Chen et al. |
| 2014/0225795 A1 | 8/2014 | Yu |
| 2015/0064498 A1 | 3/2015 | Tong |
| 2016/0049384 A1 | 2/2016 | Lu et al. |
| 2016/0343682 A1 | 11/2016 | Kawasaki |
| 2017/0036419 A1 | 2/2017 | Adib et al. |
| 2017/0194271 A1 | 7/2017 | Hsu et al. |
| 2017/0338143 A1* | 11/2017 | Peidous ............ H01L 21/76251 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0123709 A1 | 4/2019 | Inoue et al. |
| 2019/0131277 A1 | 5/2019 | Yang et al. |
| 2019/0157333 A1 | 5/2019 | Tsai |
| 2019/0164919 A1 | 5/2019 | Hu et al. |
| 2019/0170631 A1 | 6/2019 | Shachar et al. |
| 2019/0198409 A1 | 6/2019 | Katkar et al. |
| 2019/0221607 A1 | 7/2019 | Gudeman |
| 2019/0265411 A1 | 8/2019 | Huang et al. |
| 2019/0288660 A1 | 9/2019 | Goto et al. |
| 2019/0295883 A1* | 9/2019 | Yokokawa ............ H01L 27/12 |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0006145 A1 | 1/2020 | Li et al. |
| 2020/0006266 A1 | 1/2020 | Chen et al. |
| 2020/0013637 A1 | 1/2020 | Haba |
| 2020/0028486 A1 | 1/2020 | Kishino et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0328193 A1 | 10/2020 | Enquist et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |

FOREIGN PATENT DOCUMENTS

| | | | |
|---|---|---|---|
| EP | 0616426 B1 | 9/1998 | |
| EP | 0591918 B1 | 7/1999 | |
| EP | 1540736 A4 | 3/2006 | |
| EP | 3 482 231 B1 | 9/2022 | |
| JP | 2002334816 A * | 11/2002 | |
| JP | 2011200933 A | 10/2011 | |
| JP | 2013-33786 A | 2/2013 | |
| JP | 2018-160519 A | 10/2018 | |
| KR | 10-2015-0097798 | 8/2015 | |
| KR | 10-2018-0114896 | 10/2018 | |
| WO | 2005-043584 A2 | 5/2005 | |
| WO | WO 2006/100444 A1 | 9/2006 | |
| WO | WO-2015191082 A1 * | 12/2015 | ......... H01L 23/5226 |
| WO | WO 2017/151442 A1 | 9/2017 | |
| WO | WO-2019180922 A1 * | 9/2019 | |

(56) References Cited

OTHER PUBLICATIONS

Suga et al., "Combined Process for Wafer Direct Bonding by Means of the Surface Activation Method", IEEE (2004): pp. 484-490. (Year: 2004).*

Takagi et al., "Room-temperature wafer bonding of Si to LiNbO3, LiTaO3 and Gd3Ga5O12 by Ar-beam surface activation", J. Micromech. Microeng. 11 (2001): pp. 348-352. (Year: 2001).*

Taylor et al., "A review of plasma oxidation of silicon and its applications", Semicond. Sci. Technol. 8 (1993): pp. 1426-1433. (Year: 1993).*

Shen et al., "Structure and Magnetic Properties of Ce-Substituted Yttrium Iron Garnet Prepared by Conventional Sintering Techniques", J Supercond (2017): pp. 937. (Year: 2017).*

Vasili et al, "Direct observation of multivalent states and 4 f → 3d charge transfer in Ce-doped yttrium iron garnet thin films", Physical Review (2017): pp. 1-10. (Year: 2017).*

Darling, R.B., "Wafer Bonding," EE-527: Microfabrication, Winter 2013, 12 pages.

Mizumoto et al., "Direct Wafer Bonding and Its Application to Waveguide Optical Isolators," Department of Electrical and Electronic Engineering, Tokyo Institute of Technology, Materials, ISSN: 1996-1944, www.mdpi.com/journal/materials, Mar. 31, 2012, 20 pages.

"Wafer Bonding—An Overview," ScienceDirect Topics, Journals & Books, https://www.sciencedirect.com/topics/engineering/wafer-bonding, printed Jun. 27, 2019, 12 pages.

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.

Plobi et al., "Wafer Direct Bonding: Tailoring Adhesion Between Brittle Materials," Materials Science and Engineering Review Journal, 1999, 88 pages.

International Search Report and Written Opinion for PCT/US2019/040255, dated 2019 Oct. 25, 2019, 12 pages.

Amirfeiz et al., "Formation of silicon structures by plasma-activated wafer bonding," Journal of The Electrochemical Society, 2000, vol. 147, No. 7, pp. 2693-2698.

Bengtsson, S. et al., "Low Temperature Bonding," International Conference on Compliant & Alternative Substrate Technology, Meeting Program & Abstract Book, Sep. 29-23, p. 10.

Farrens et al., "Chemical Free Room Temperature Wafer to Wafer Direct Bonding", J. Electrochem. Soc., vol. 142, No. 11, Nov. 1995, pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele, U. et al., "Semiconductor Wafer Bonding, a Flexible Approach to Materials Combinations in Microelectronics, Micromechanics and Optoelectronics", 1997 IEEE, pp. 23-32.

International Search Report and Written Opinion dated Feb. 7, 2014 in PCT/US2013/057536 filed Aug. 30, 2013.

International Search Report and Written Opinion dated Mar. 7, 2019, in International Application No. PCT/US2018/060044, 14 pages.

International Search Report and Written Opinion dated Apr. 22, 2019 in International Application No. PCT/US2018/064982, 13 pages.

Reiche et al., "The effect of a plasma pretreatment on the Si/Si bonding behaviouir," Electrochemical Society Proceedings, 1998, vol. 97-36, pp. 437-444.

Taiwan Office Action dated Feb. 10, 2023, in Taiwan Application No. 108123486, 3 pages.

* cited by examiner

525 μm SILICON WAFER DIRECT-BONDED TO 360 μm LITHIUM TANTALATE WAFER

| Silicon | 50C 96hr 1st anneal | | | | 100C 36hour 2nd anneal | | | |
|---|---|---|---|---|---|---|---|---|
| | bond energy | | wafer bow | | bond energy | | wafer bow | |
| | mJ/M2 | | top to flat um | side to side um | mJ/M2 | | top to flat um | side to side um |
| Si-LiT | 891 | 1074 | -6 | -6 | 1305 | 1074 | -24 | -14 |
| Si-LiT | 891 | 1074 | -9 | -7 | 1074 | 1602 | -21 | -19 |

*FIG. 9*

TECHNIQUES FOR JOINING DISSIMILAR MATERIALS IN MICROELECTRONICS

RELATED APPLICATIONS

This nonprovisional patent application claims the benefit of priority to U.S. Provisional Patent Application No. 62/693,671 to Fountain et al., filed Jul. 3, 2018 and incorporated by reference herein, in its entirety.

BACKGROUND

Certain types of microelectronic devices are conventionally discouraged from manufacture because they would require joining of different materials that have not yet been bonded together with very great success. The bonding surfaces in these micro-devices are sometimes only a few microns across. Abbreviations for units used herein include "μm" for micron or micrometer (1 micron=one-thousandth of a millimeter); and "nm" for nanometer (1000 nanometers=1 micron).

There are several difficulties that arise in attempts to form useful surface bonds between different materials to be used in semiconductor device fabrication and microelectronic packaging. First, the multi-layer dielectric and metal layers that are deposited on the various substrates often cause stress which manifests as an overall wafer bow and local warpage of the substrates. One challenge of bonding these highly warped substrates is the need to place them under vacuum to force the surfaces to be flat during bonding.

Second, the different materials have different crystal lattice properties. Traditional bonding techniques use elevated temperature and pressure to join materials. However, after bonding, the composite system is cooled to room temperature for subsequent processing and then operation temperature (generally well below the bond temperature). Direct bonding offers a way to reduce the overall stress and strain and join at lower temperatures. Both metals and nonmetals possess crystal lattice unit cells, the basic structural building blocks of each material at or near the atomic level. The crystal lattice units of the different materials may differ in geometry, or they may have similar geometries, but differ in the scale of these similar units. Either way, direct face-to-face bonding between materials that have different crystal-lattice-unit cell geometries can cause strain problems at the interface. With direct bonding, the thermal fluctuation between the two materials during bonding and subsequent rising temperatures in anneal or when the device is in electrical operation, can cause two materials that are bonded together to expand at different rates as the temperature rises, due to differences in their respective coefficients of thermal expansion (CTEs).

Ideally, a first material on one side of a face-to-face bond should possess a crystalline nature that has at least one well-defined orientation with respect to the internal crystal structure of the second material, and this orientation is sometimes called single-domain epitaxy. A lattice constant is a physical dimension of the unit cells in a crystal lattice of one of the materials. Lattices in three dimensions generally have three lattice constants: a, b, and c. Matching the lattice constants between materials to be bonded at small microelectronic scales is desirable for avoiding weak and defective bonds between the two different materials.

Bonding together of different materials can also have electronic effects that are important in microelectronic devices. For example, matching the lattice structures between two different semiconductor materials can form a region of band gap change without altering crystal structure. This enables the existence of some types of optical devices, such as light-emitting diodes, and lasers. Band gap is an energy range in a solid or two bonded solids where there are no electron states, and the gap can be characterized as the energy difference between a top of the valence band and a bottom of the conduction band in semiconductors and insulators, or from another view, the energy needed to free a bound (valence) electron to become a conduction electron for conducting electrical current.

Conventional bonding together of substances with similar lattice constants, as such gallium arsenide, aluminum gallium arsenide, and aluminum arsenide has provided many breakthrough optical devices, such as LEDs, and lasers, for example. The ability to usefully bond together more diverse materials is expected to provide even more new devices of microelectronic scale.

Sometimes fabrication of a microelectronic device would only need two different materials to be reliably direct-bonded across a very thin bonding interface, without regard for the materials' electronic effects on each other, but the respective differences in CTEs and differences in their lattice constants (lattice unit cell geometries) have conventionally made joining of these materials impossible or impractical.

SUMMARY

Techniques for joining dissimilar materials in microelectronics are provided. Example techniques include direct-bonding of dissimilar materials to each other at room temperature using a thin amorphous layer of material added to either one or both bonding surfaces of the dissimilar materials, which may be in the form of two different substrates to be joined together. Silicon oxide, silicon nitride, or silicon carbide, silicon carbonitride, silicon oxynitride, and mixtures of these dielectric materials, are examples of materials for making the thin amorphous layer, which constitutes a thin film approximately 100-1000 nm thick, for example. The dissimilar substrate materials may have significantly different coefficients of thermal expansion (CTEs) and/or significantly different crystal-lattice unit cell geometries or dimensions, conventionally resulting in too much strain to make direct-bonding feasible or reliable. Preparation of the substrates prior to direct-bonding can include adding dielectric layers to the backside of the substrates to reduce warpage, in order to render these substrates flat without a need for vacuum, thereby reducing the stress and strain at the bonding interface. These warpage reduction layers may be removed in the standard post-bond processing, after serving their purpose. After bonding, an annealing sequence achieves a well-bonded interface. The process includes a curing period at room temperature after the direct-bonding of dissimilar materials, which can strengthen the direct bonds and the resulting direct-bond energies by over 200%. A relatively low temperature anneal applied slowly at a rate of 1° C. per minute further strengthens the direct bonds. The example techniques can be utilized to direct-bond III-V semiconductors, lithium tantalate LiTaO$_3$, or other non-silicon materials to silicon or other materials that previously presented bonding challenges, to various conventional substrates in wafer-to-wafer (W2W), die-to-wafer (D2W), and die-to-die (D2D) processes thereby enabling various novel optical, electrical, and acoustic devices.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIG. 9 is a diagram of example direct-bond energy increases at different anneal durations and different temperatures, with slow temperature increase during anneal.

DETAILED DESCRIPTION

Overview

Figure 1:
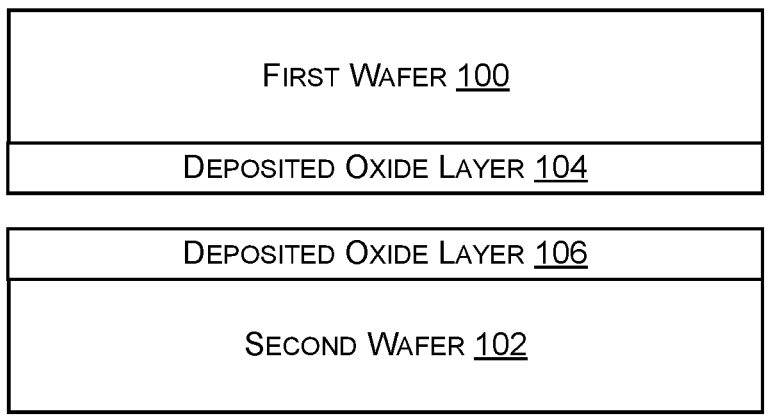
FIG. 1 is a diagram of example substrates, such dies and/or wafers, made of dissimilar materials direct-bonded together via deposited oxide layer or native oxide film using the example techniques described herein.
Figure 1:
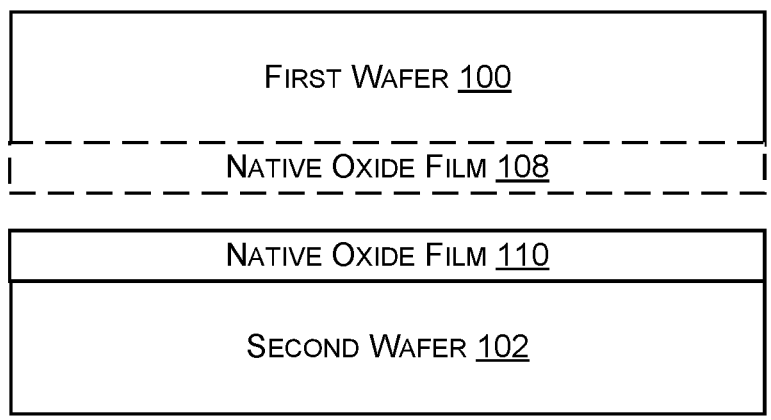

This disclosure describes example techniques, processes, and methods for successfully joining diverse and dissimilar materials to each other in microelectronics, and describes resulting layer structures and devices. The example processes and structures apply to materials already routinely used in semiconductor fabrication and in the microelectronic packaging arts, and to combinations of materials not conventionally used in these arts. The example techniques, processes, and methods described herein are provided for fabricating novel semiconductor and microelectronic devices, and also for fabricating conventional devices with more efficient and practical designs.

Although the example processes described herein can theoretically be applied and used between many and almost all solid, amorphous, and/or crystalline materials, a few materials are now described as representative examples, for the sake of description and illustration of the example processes and resulting structures.

Lithium tantalate ($LiTaO_3$ or simply "LiT") is a mineral and a compound of lithium, tantalum, and oxygen that possesses useful optical and electronic properties in the microelectronic arts. As a useful component of potential microelectronic devices, $LiTaO_3$ has optical, piezoelectric, and pyroelectric properties that make it useful for nonlinear optics, passive infrared sensors and motion detectors, terahertz generation and detection, surface acoustic wave applications, cell phone applications, cooling, heating, and small scale production of neutrons (atomic particles) for the nuclear industry, for example. $LiTaO_3$ has a relatively large thermal expansion coefficient, with thermal expansion on the order of 12 ppm that varies along different crystalline axis directions. If $LiTaO_3$ is warped during heating it develops an internal charge imbalance, which can result in residual warpage after cooling. In a pyroelectric effect, $LiTaO_3$ generates a temporary voltage within itself, when heated or cooled, without any imposed physical warping. Changes in temperature slightly modify positions of atoms within its crystal structure changing the polarization of the material. In a different but related piezoelectric effect, $LiTaO_3$ also generates an electric charge in response to applied mechanical stress (the imposed warpage). These pyroelectric and piezoelectric effects of $LiTaO_3$ should be taken into account when bonding this material to another substrate made of different material.

Analogously, lithium niobate ($LiNbO_3$) is a compound of lithium, niobium, and oxygen. Crystals of $LiNbO_3$ are useful as optical waveguides, in mobile phones, as piezoelectric sensors, optical modulators and in various other linear and non-linear optical applications. $LiNbO_3$ is considered an artificially made dielectric material that does not exist in nature.

Example techniques described herein enable direct-bonding of $LiTaO_3$ (or $LiNbO_3$) to other semiconductor, dielectric, and insulator materials for purposes of making practical microelectronic devices. In the description which follows, $LiTaO_3$ is described representatively for both $LiTaO_3$ and $LiNbO_3$ and for many other similar materials too. As above, the example techniques, processes, and methods herein can be applied between almost any solid materials, but $LiTaO_3$ is used in the descriptions representatively, as an example of a material to be joined to other materials that are dissimilar in CTEs, lattice unit cell geometries, or other properties.

$LiTaO_3$ has conventionally proven incompatible for direct-bonding with important semiconductor and dielectric materials such as silicon (Si), glass (amorphous silicon dioxide $SiO_2$ and other ingredients), fused silica (glass made of pure silicon dioxide $SiO_2$), sapphire, and other common and uncommon substrates used, or that could be used, in the semiconductor and microelectronic fabrication and packaging arts.

Example techniques described below enable practical use of $LiTaO_3$ in microelectronic devices, especially in wafer-level fabrication of microelectronic devices, wherein the fabrication can be greatly optimized by using direct-bonding and/or direct hybrid bonding between the surfaces of the different or incompatible materials (between substrates, such as those of dies and/or wafers made of different materials being joined to make the novel or conventional microelectronic devices).

Example Techniques

In an example process, a low temperature bonding process enables heterogeneous integration of diverse materials within a microelectronic device. This low temperature bonding process can be especially useful in fabrication processes that use substrates, such as those of dies or wafers made of two different materials that are conventionally incompatible with each other with respect to conventional direct-bonding processes.

FIG. 1 shows example structures in which a first wafer 100 of a first material is to be direct-bonded to a second wafer 102 of a second material at room temperature. Room temperature is defined in its usual way as a humanly comfortable ambient temperature, generally around 70° F. or around 21.1° C. The first material of the first wafer 100 possesses a first coefficient of thermal expansion (CTE) and a first set of physical dimensions of respective unit cells of a first crystal lattice of the first material, while the second material of the second wafer 102 possesses a second CTE and a second set of physical dimensions of respective unit cells of a second crystal lattice of the second material. The second CTE of the second wafer 102 is different from the first CTE of the first material and/or the second set of physical dimensions of the unit cells of the second wafer 102 is different from the first physical dimensions of the unit cells of the first material of the first wafer 100.

Respective thin oxide, carbide, nitride, carbonitride, oxynitride layers 104 & 106, or combinations thereof, are deposited on one or both bonding surfaces of the first wafer 100 and the second wafer 102. The deposited oxide, carbide, nitride, carbonitride, or oxynitride layers 104 & 106 may be only 100-1000 nm thick, and serve as direct-bonding intermediaries between the wafers 100 & 102. The deposited oxide, carbide, nitride, carbonitride, or oxynitride layers 104 & 106 are a different compound than either the first material of the first wafer 100 or the second material of the second wafer 102. So the direct-bonding described herein is different than conventional direct-bonding, which is often described as molecular bonding directly between two surfaces made of the same atoms or molecules: the same material being bonded to itself across an interface.

The first wafer 100 and the second wafer 102 are then direct-bonded together at room temperature to make a joined wafer, with the thin amorphous layer of oxide, carbide, nitride, carbonitride, or oxynitride intervening at the molecular bonding interface. The amorphous layer may comprise silicon.

The joined wafer is held for approximately 48 hours to strengthen direct bonds in a passive curing stage, wherein solid crystal bonds or other bonds at the solid bonding interface are allowed to spontaneously consolidate and seek their most stable energy levels under normal molecular kinetic motion at the room temperature level.

The joined wafer is then annealed by slowly raising the ambient temperature from room temperature level to a relatively low annealing temperature of 50° C. at a temperature increase rate of about 1° C. per minute or less, to anneal the direct bonds of the joined wafer.

Additional Example Processes

The direct-bonding of dissimilar materials at room temperature to make a microelectronic device can also be accomplished by creating one or more native oxide (or carbide, nitride, carbonitride, oxynitride, etc.) films 108 & 110 on one or both bonding surfaces of the first wafer 100 and second wafer 102. This can be accomplished by exposing the bonding surface(s) to a strong oxidizing solution, or oxygen plasma, for example, or other reactive agent in the cases of native carbide generation or native nitride generation.

As introduced above, challenges in heterogeneous integration of different materials within a microelectronic device are related to the differential CTEs, incompatibility of lattice unit cells at the bonding interface, as often indicated by respective lattice constants that vary greatly between materials, and differences in general material properties.

The example direct-bonding process that utilizes a step of creating a native oxide layer (or carbide layer, nitride layer, carbonitride, oxynitride, etc.) aims to take advantage of two or more substrates made of different materials that have specific advantages provided by the properties of devices that can be fabricated on each respective different type of substrate, now joined in one device by the example direct-bonding process. The example low temperature bonding technique enables multiple integration possibilities for a broad field of electronic devices.

In an implementation, the example process begins by thermally equilibrating the different materials to be direct-bonded together with each other and with the environment. In other words, the direct-bonding process begins with all materials and the environment at the same temperature, providing an equilibrium of molecular kinetic energy among the materials being used. This equilibrium controls/prevents uncontrolled flows of heat energy between materials or across the bonding interface during the initial contact of bonding surfaces during the direct-bonding process, resulting in exquisite homogeneity of the direct-bonds formed at small scale, and results in exquisite control of the example process. In other words, the careful equilibrium of temperature at the start of this example direct-bonding process can ultimately ensure a very uniform bonded interface, at the molecular level. In one implementation, this uniformity of the direct-bonded interface is limited only by the degree of flatness achievable on the surfaces to be direct-bonded together prior to contact between the two surfaces.

The example direct-bonding is performed at room temperature, and then held at room temperature for up to 48 hours or more for curing, even before an annealing step, to greatly increase bond energy: the bond strength that will be present after a subsequent annealing step is completed.

For example, with wafers that have large differences from each other with respect to CTEs, the wafers are kept at room temperature for a period of time after direct-bonding for a curing that allows bond energy to increase even before elevating the temperature during annealing to speed up the bond energy increase. Bond strengths of 1000 $mJ/m^2$ or greater have been measured with this example room temperature curing technique.

Figure 2:
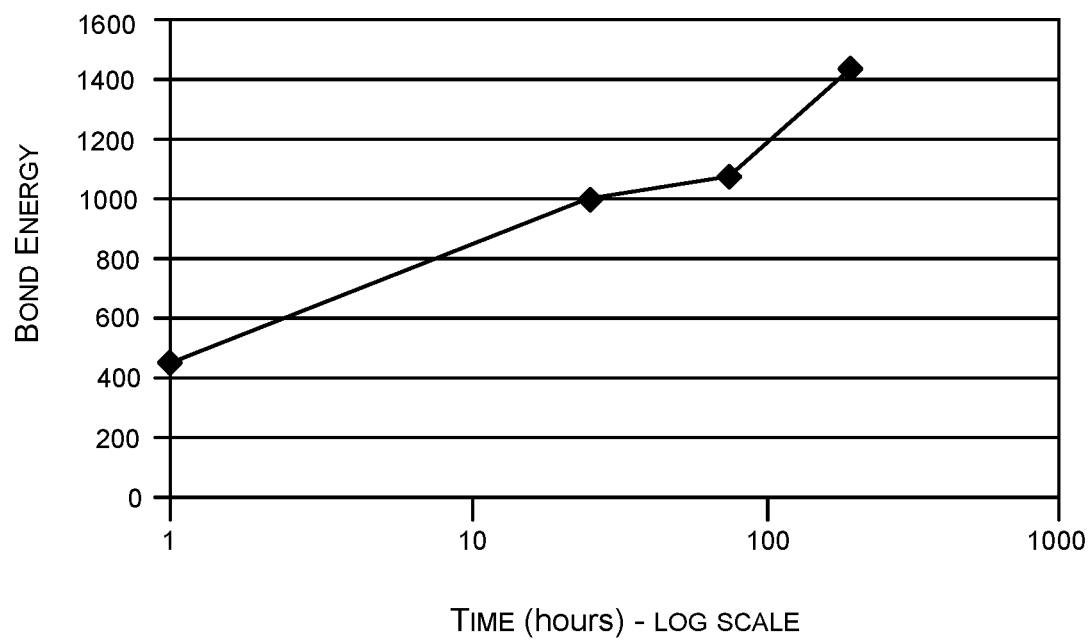
FIG. 2 is a diagram of direct-bond energy versus curing time with respect to example techniques described herein.

FIG. 2 shows example increase in bond energy versus curing time at room temperature after direct-bonding of dissimilar wafer materials. One example technique uses TEOS (tetraethoxysilane) in TEOS-to-TEOS direct oxide bonding with nitrogen plasma surface activation followed by an example 29% $NH_4OH$ (aqueous ammonia) rinse. Bond strengths of 1000 $mJ/m_2$ or greater have been measured with this example room temperature curing of the bond, before the annealing stage of direct-bonding.

Example Room Temperature Direct-Bonding Techniques Using Thin Amorphous Intermediary Bonding Layer to Join Dissimilar Materials Some example processes for direct-bonding dissimilar materials at room temperature use a thin intermediary layer less than 1 micron thick (between approximately 100-1000 nm) as an "adapter" layer between diverse oxides, carbides, nitrides, carbonitrides, or oxynitrides for the direct-bonding. This thin intermediary layer may be an amorphous oxide layer, such as silicon dioxide ($SiO_2$), with a thickness dimension within the range above, less than 1 micron thick. Silicon dioxide films can be grown by a plasma enhanced chemical vapor deposition (PECVD) system using liquid tetraethoxysilane (TEOS) as the source of Si, or by TEOS photochemical decomposition, for example.

Figure 3:
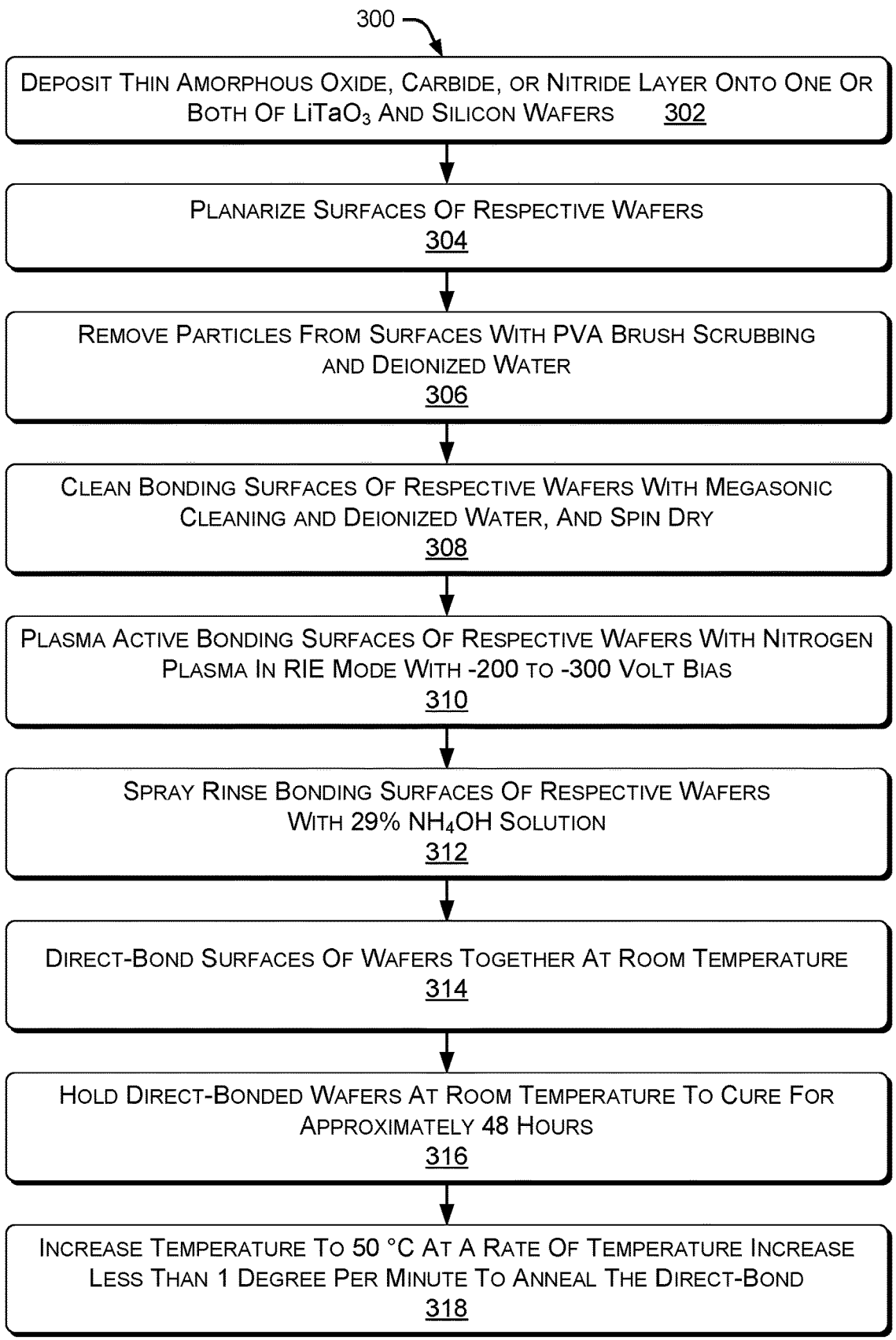
FIG. 3 is a flow diagram of an example process for direct-bonding $LiTaO_3$ with silicon.

FIG. 3 shows a first example process 300, in which a LiTaO₃ wafer, substrate, or surface is direct-bonded at room temperature to a silicon wafer, substrate, or surface via an intervening thin amorphous bonding layer made of an oxide material, such as SiO₂, or another thin amorphous dielectric intermediary for direct-bonding, such as a nitride, carbide, carbonitride, or oxynitride. In the flow diagram of FIG. 3, operations of the example process 300 are shown in individual blocks.

At block 302, a material such as TEOS-derived amorphous SiO₂ is deposited onto one or both of the LiTaO₃ wafer, substrate, or surface and/or the silicon wafer, substrate, or surface. The layer of oxide material may have a deposited thickness of approximately 100-1000 nm (0.1-1.0 microns).

At block 304, the respective surfaces of LiTaO₃ and SiO₂, one or both of these surfaces covered with the thin amorphous film of oxide, carbide, nitride, carbonitride, and/or oxynitride, are planarized by chemical mechanical planarization (CMP) to a smooth, flat surface. Asperities including defects and rough spots that would cause bonding voids can be removed at this step.

At block 306, the respective wafers, substrates, or surfaces may be cleaned with scrubbing by PVA brush, and a deionized (DI) water rinse.

At block 308, the respective wafers, substrates, or surfaces may be cleaned with a Megasonic SC1 process, rinsed with DI water and spin-dried on a Goldfinger® processing tool, for example, for megasonic wave particle removal without etching.

At block 310, the wafers, substrates, or surfaces are plasma-activated with nitrogen plasma in RIE mode, for example with a −200 to −300 volt bias. This nitrogen plasma activation with such parameters may be unique when applied to LiTaO₃ direct-bonding.

At block 312, the wafers, substrates, or surfaces are spray-rinsed with 29% NH₄OH (aqueous ammonia). This rinse with 29% NH₄OH may also be a unique process when applied to the LiTaO₃ direct-bonding. The NH₄OH rinsing helps to remove particles from the wafers, substrates, or surfaces. In some cases, depending on materials, the NH₄OH rinsing can help to increase bond energy. The wafers, substrates, or surfaces may be spin-dried on a spin bonder tool, for example.

At block 314, the wafers, substrates, or surfaces are contacted with each other for direct-bonding at room temperature, with the LiTaO₃ wafer, for example, loaded as the top wafer. Infrared (IR) drying lamps are not used to avoid excessive bowing and warping upon bonding. The room temperature bonding also avoids excessive bowing of the wafers. Likewise, heating during spin drying could also cause bowing of the LiTaO₃, which does not fully relax after cooling due to pyroelectric charge build up in the LiTaO₃ material, so such heated spin-drying after direct bonding may be avoided.

At block 316, the wafers (or bonded substrates or bonded surfaces) are held at room temperature for 48 hours, as an example duration, to allow bond strength to increase before slowly elevating temperature for the subsequent annealing step. The bonding strength increases in relation to the time duration allowed for the room temperature curing, as shown in FIG. 2.

At block 318, the temperature of the direct-bonded wafers, substrates, or surfaces are ramped slowly up slowly to 50° C. in an oven, in a temperature elevation process of less than 1 degree ° C. per minute. This relatively low temperature annealing step avoids slippage of the bonds that are being strengthened, and minimizes bowing of the wafers (substrates or surfaces) being annealed.

Figure 4:
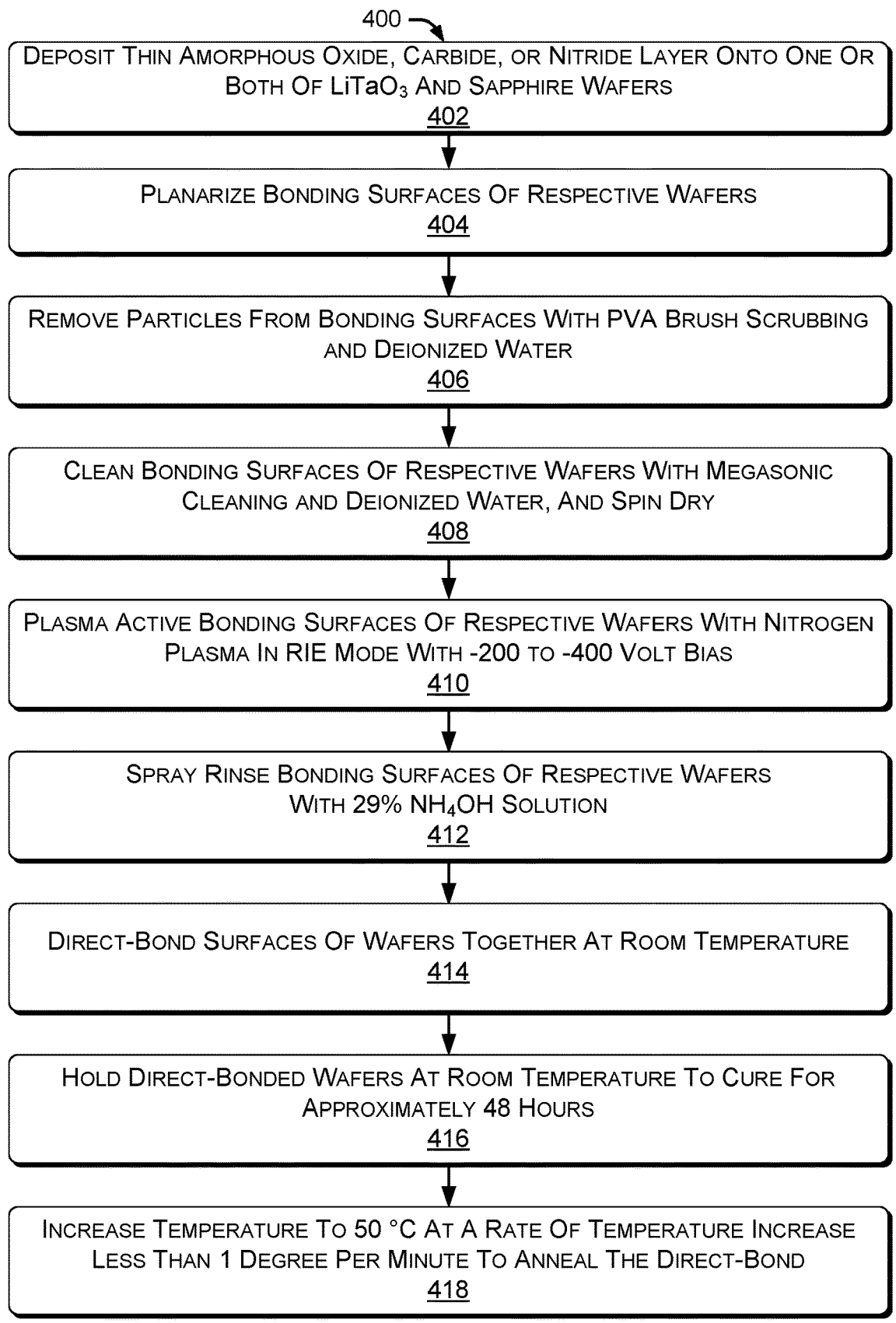
FIG. 4 is a flow diagram of an example process for direct-bonding $LiTaO_3$ with sapphire.

FIG. 4 shows a second example process 400, in which a LiTaO₃ wafer, substrate, or surface is direct-bonded at room temperature to a sapphire wafer, substrate, or surface via an intervening thin amorphous bonding layer made of an oxide material, such as SiO₂, or another thin amorphous dielectric intermediary for direct-bonding, such as a nitride, carbide, carbonitride, and/or oxynitride. In the flow diagram of FIG. 4, operations of the example process 400 are shown in individual blocks.

At block 402, a representative material such as TEOS-derived amorphous SiO₂, or a thin amorphous layer of a carbide, nitride, carbonitride, or oxynitride dielectric, is deposited onto one or both of the LiTaO₃ wafer, substrate, or surface and/or the sapphire wafer, substrate, or surface. The thin layer of the amorphous material, such as the oxide, carbide, nitride, carbonitride, or oxynitride may have a deposited thickness of approximately 100-1000 nm.

At block 404, the respective surfaces of oxide-covered LiTaO₃ and/or oxide-covered SiO₂ (or nitride, carbide, carbonitride, oxynitride, etc.), are planarized by chemical mechanical planarization (CMP) to a smooth, flat surface. Asperities, such as defects and rough spots, that would cause bonding voids can be removed at this step.

At block 406, the respective wafers, substrates, or surfaces may be cleaned with PVA brush scrubbing and deionized (DI) water.

At block 408, the respective wafers, substrates, or surfaces may be cleaned with a Megasonic SC1 process, rinsed with DI water and spin-dried on a Goldfinger® processing tool, for example, for megasonic wave particle removal without etching.

At block 410, the wafers, substrates, or surfaces are plasma-activated with nitrogen plasma in RIE mode, for example with a −200 to −300 volt bias.

At block 412, the wafers, substrates, or surfaces are spray-rinsed with 29% NH₄OH (aqueous ammonia, or ammonium hydroxide). This rinse with 29% NH₄OH may be a unique process when applied to the LiTaO₃ direct-bonding. The NH₄OH rinsing removes particles from the wafers, substrates, or surfaces. In some cases, depending on materials, the NH₄OH rinsing increases bond energy. The wafers, substrates, or surfaces may be spin-dried on a spin bonder tool, for example.

At block 414, the wafers, substrates, or surfaces are direct-bonded to each other at room temperature, with the LiTaO₃ wafer, for example, loaded as the top wafer. Infrared (IR) drying lamps are not used to avoid excessive bowing and warpage upon bonding. The room temperature bonding also avoids excessive bowing of the wafers. Likewise, heating during spin drying may cause bowing of the LiTaO₃, which does not fully relax after cooling due to pyroelectric charge build up in the LiTaO₃ material, and such heating may be avoided at this step.

At block 416, the wafers (or substrates or surfaces) are held at room temperature for at least 48 hours, as an example duration, to allow bond strength to increase and consolidate before elevating temperature for the subsequent annealing step. The bonding strength during the passive room temperature cure increases in relation to the time duration allowed, as shown in FIG. 2.

At block 418, the temperature of the direct-bonded wafers, substrates, or surfaces are ramped up to 50° C. in an oven, at a rate of temperature increase of about 1 degree °

C. per minute, or less. Sapphire is an extremely stiff material and if the wafers are not bonded strongly enough before increasing the temperature, wafer expansion and resulting warpage can cause the wafers to separate. So this relatively low temperature annealing step avoids slippage of the bond being strengthened, and minimizes bowing of the wafers being direct-bonded together.

Figure 5:
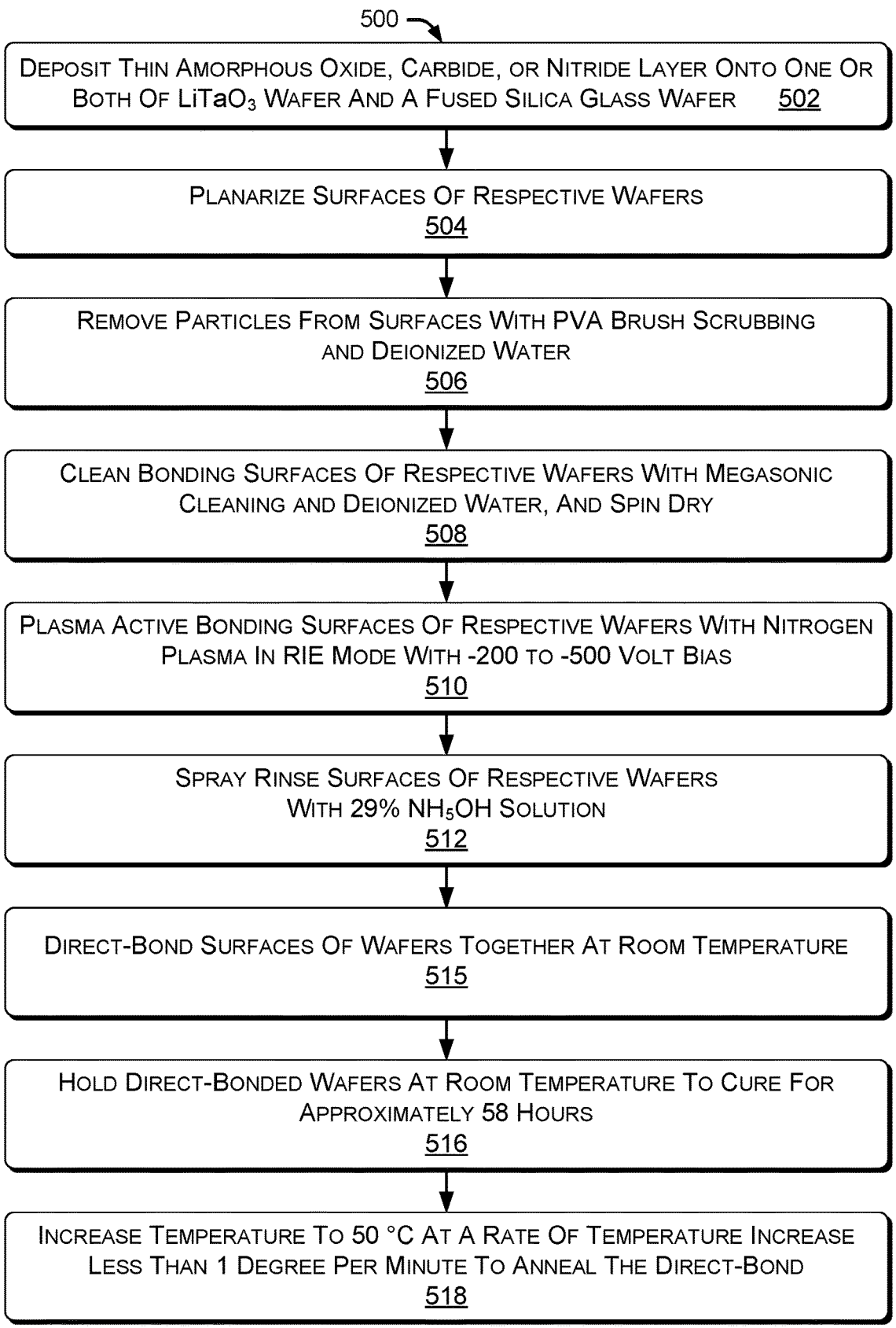
FIG. 5 is a flow diagram of an example process for direct-bonding $LiTaO_3$ with fused silica glass.

FIG. 5 shows a third example process 500, in which a $LiTaO_3$ wafer, substrate, or surface is direct-bonded at room temperature to a fused silica glass wafer, substrate, or surface via an intervening thin amorphous bonding layer made of an oxide material, such as $SiO_2$, or made of a nitride, carbide, carbonitride, or oxynitride dielectric. In the flow diagram of FIG. 5, operations of the example process 500 are shown in individual blocks.

At block 502, a material such as TEOS-derived amorphous $SiO_2$ (or a nitride, carbide, carbonitride, or oxynitride) is deposited onto one or both of the $LiTaO_3$ wafer, substrate, or surface and/or the fused silica glass wafer, substrate, or surface. The thin layer of material, such as the oxide, nitride, carbide, carbonitride, or oxynitride may have a deposited thickness of approximately 100-1000 nm.

At block 504, the respective surfaces of oxide-covered $LiTaO_3$ and/or oxide-covered $SiO_2$, for example, are planarized by chemical mechanical planarization (CMP) to a smooth, flat surface. Asperities including defects and rough spots that would cause bonding voids can be removed at this step.

At block 506, the respective wafers, substrates, or surfaces may be cleaned with PVA brush scrubbing and deionized (DI) water.

At block 508, the respective wafers, substrates, or surfaces may be cleaned with a Megasonic SC1 process, rinsed with DI water and spin-dried on a Goldfinger® processing tool, for example, for megasonic wave particle removal without etching.

At block 510, the wafers, substrates, or surfaces are plasma-activated with nitrogen plasma in RIE mode, for example with a −200 to −300 volt bias. This nitrogen plasma activation with these parameters may be unique when applied to $LiTaO_3$ direct-bonding.

At block 512, the wafers, substrates, or surfaces are spray-rinsed with 29% $NH_4OH$ (aqueous ammonia or ammonium hydroxide). This rinse with 29% $NH_4OH$ may be a unique process when applied to the $LiTaO_3$ direct-bonding. The $NH_4OH$ rinsing removes particles from the wafers, substrates, or surfaces. In some cases, depending on materials, the $NH_4OH$ rinsing increases bond energy. The wafers, substrates, or surfaces may be spin-dried on a spin bonder tool, for example.

At block 514, the wafers, substrates, or surfaces are direct-bonded to each other at room temperature, with the $LiTaO_3$ wafer, for example, loaded as the top wafer. Infrared (IR) drying lamps are not used to avoid excessive bowing and warpage upon bonding. The room temperature bonding also avoids excessive bowing of the wafers, for example. Likewise, heating during spin drying may also cause bowing of the $LiTaO_3$, which does not fully relax after cooling due to pyroelectric charge build up in the $LiTaO_3$ material, and such heating may be avoided.

At block 516, the wafers (or substrates or surfaces) are held at room temperature for at least 48 hours, for example, to allow bond strength to increase before elevating temperature for the subsequent annealing step. The bonding strength increases in relation to the time duration allowed for room temperature curing, as shown in FIG. 2.

At block 518, the temperature of the direct-bonded wafers, substrates, or surfaces is ramped up to 50° C. in an oven, at a rate of temperature rise that is about 1 degree per minute, or preferably less. This relatively low-temperature annealing step avoids slippage of the bonds being strengthened, and minimizes bowing of the wafers being direct-bonded together.

Figure 6:
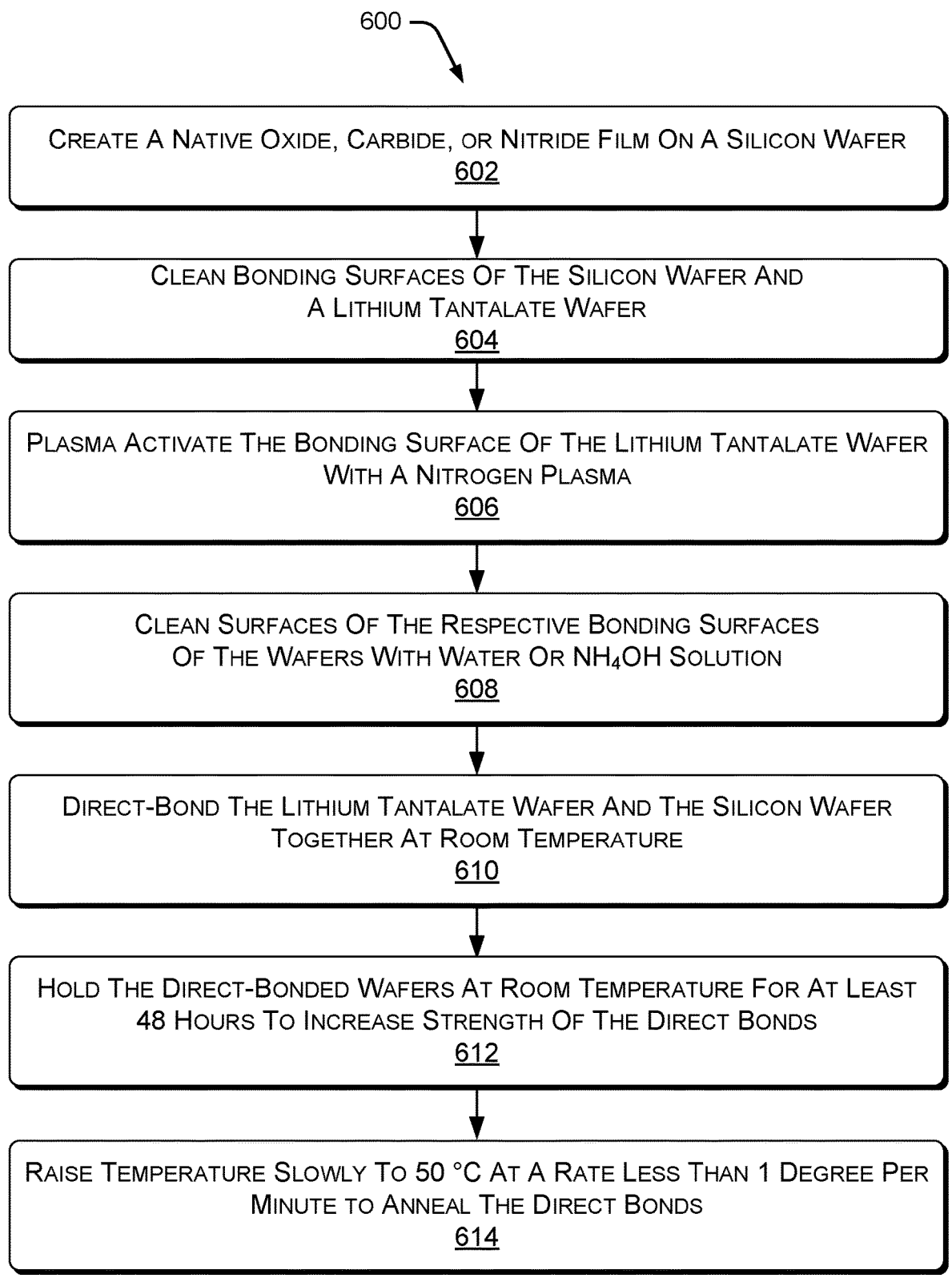
FIG. 6 is a flow diagram of an example process for direct-bonding $LiTaO_3$ with silicon by creating a native oxide of the $LiTaO_3$ and/or the silicon.

Example Room Temperature Direct-Bonding Techniques for Joining Dissimilar Materials without a Discrete Intervening Bonding Layer FIG. 6 shows a fourth example process 600, for direct-bonding a representative $LiTaO_3$ wafer at room temperature to a silicon wafer, without depositing a discrete layer of an oxide, carbide, nitride, carbonitride, or oxynitride material as a bonding intermediary. In the flow diagram of FIG. 6, operations of the example process 600 are shown in individual blocks.

At block 602, a native oxide (of silicon) or oxide patina of silicon is created on the silicon wafer. In one implementation, the native oxide may be created by first cleaning the wafer with a piranha solution of hydrogen peroxide-sulfuric acid ($H_2O_2$:$H_2SO_4$) in a ratio of 1:3, and then rinsing with water. The 1:3 $H_2O_2$:$H_2SO_4$ solution grows or creates a native oxide film on the silicon, which is conducive to forming high strength bonds in oxide-to-oxide direct-bonding.

At block 604, the surface of the silicon wafer with native oxide is rinsed in a Megasonic deionized water process and can be spun and rinsed dry on a Goldfinger® processing tool, for example.

At block 606, the surface of the $LiTaO_3$ wafer (only) is plasma-activated with nitrogen plasma in RIE mode with a −200 to −300 volt bias.

At block 608, both wafers are spray-rinsed with deionized water. The silicon wafer is rinsed with water to avoid pitting the silicon and native oxide surface, although the native oxide may be enough to protect the silicon surface, in which case use of $NH_4OH$ solution to enhance direct-bonding may be preferred. Although the $LiTaO_3$ wafer is usually cleaned with water, cleaning with $NH_4OH$ solution can also be performed. In some cases, rinsing with the $NH_4OH$ increases direct-bond energies to more complete potential. The wafers are then spin-dried, for example on a bonder tool.

At block 610, the wafers are direct-bonded together at room temperature with the $LiTaO_3$ wafer loaded as the top wafer, for example. Infrared drying lamps are generally avoided to prevent excessive bowing and warpage upon direct-bonding. Room temperature direct-bonding also avoids excessive bowing of the wafers. Heating during the spin-drying could cause bowing of the $LiTaO_3$ wafer, which does not fully relax after cooling due to pyroelectric charge build-up in the $LiTaO_3$ material, so can be avoided at this step.

A block 612, the joined and direct-bonded wafers are held at room temperature for at least 48 hours or more to allow bond strength to increase before elevating the temperature in a subsequent annealing step. The bond strength increases in relation to the duration of the room temperature cure, as shown in FIG. 2.

At block 614, the joined and direct-bonded wafers are warmed and heated in an oven up to a temperature of approximately 50° C. to anneal, at a rate of temperature increase that is 1 degree ° C. per minute, or less. This relatively low-temperature anneal applied gradually avoids slippage of the direct-bonds and minimizes bowing and warpage.

Figure 7:
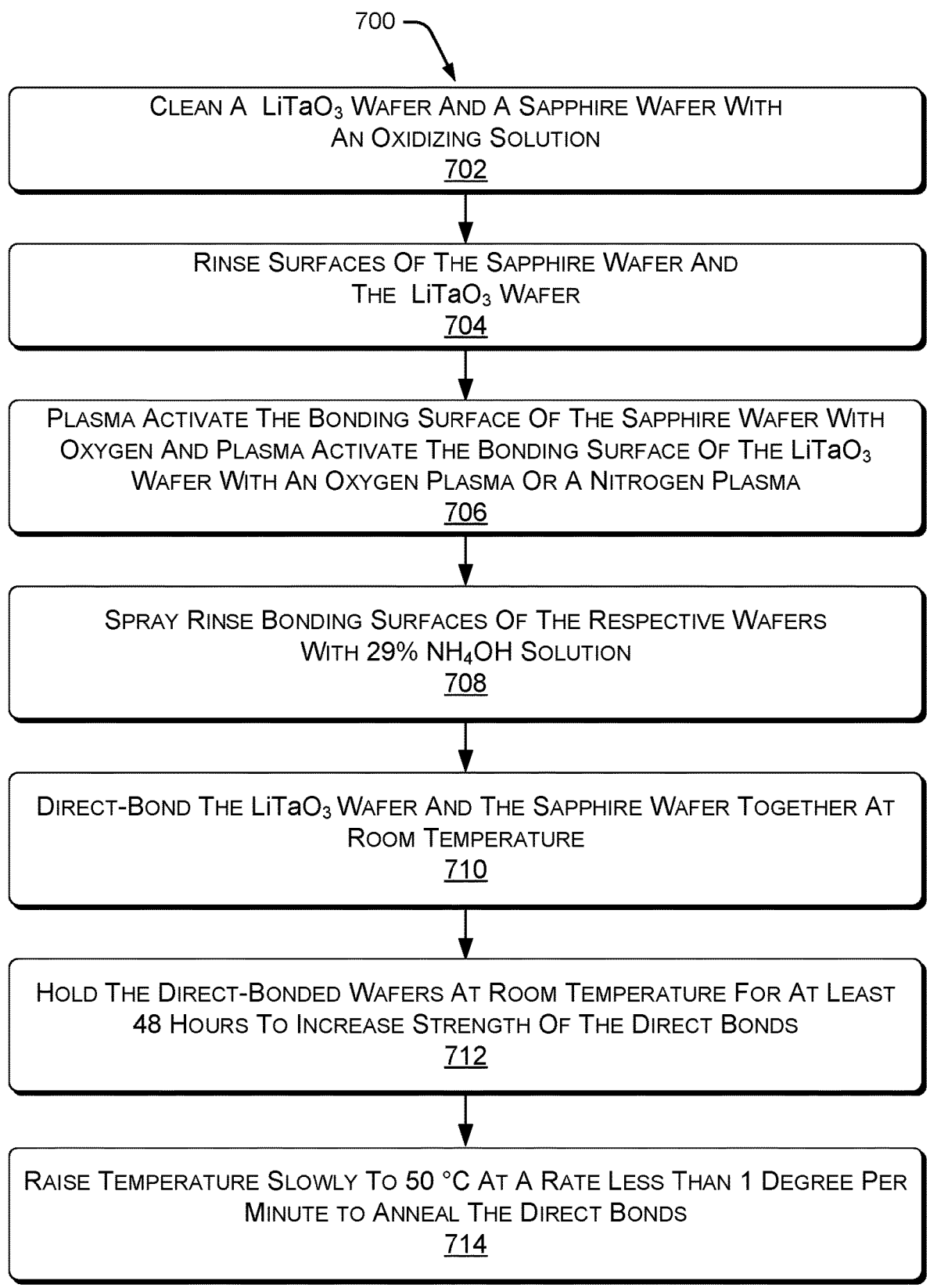
FIG. 7 is a flow diagram of an example process for direct-bonding $LiTaO_3$ with sapphire by creating a native oxide of the $LiTaO_3$ and/or the sapphire.

FIG. 7 shows a fourth example process 700, for direct-bonding a $LiTaO_3$ wafer at room temperature to a sapphire wafer without depositing a discrete layer of an oxide, carbide, nitride, carbonitride, or oxynitride material as a bonding intermediary. In the flow diagram of FIG. 7, operations of the example process 700 are shown in individual blocks.

At block 702, the $LiTaO_3$ wafer and a sapphire wafer are cleaned with a piranha solution of hydrogen peroxide and sulfuric acid ($H_2O_2:H_2SO_4$) in a ratio of 1:3, and then rinsed with water.

At block 704, the surfaces of the wafers are rinsed in a Megasonic deionized water process and can be spun and rinsed dry on a Goldfinger® processing tool, for example.

At block 706, the surface of sapphire wafer is plasma-activated with oxygen in RIE mode with a −200 to −300 volt bias, and the surface of the $LiTaO_3$ wafer is plasma-activated with oxygen or nitrogen plasma in RIE mode with a −200 to −300 volt bias.

At block 708, the wafers are spray-rinsed with 29% $NH_4OH$ solution to remove particles and to enhance the bond energies possible in the direct-bonding process. The wafers may be spun dry.

At block 710, the wafers are contacted together for the direct-bonded at room temperature with the $LiTaO_3$ wafer loaded as the top wafer, for example. Infrared drying lamps may be avoided to prevent excessive bowing and warpage upon direct-bonding. The room temperature direct-bonding avoids excessive bowing of the wafers as well as allows stronger direct-bonds to form across the dissimilar materials. Heating during the spin drying would cause bowing of the $LiTaO_3$ wafer, which does not fully relax after cooling due to pyroelectric charge build-up in the $LiTaO_3$ material, so this heating may be omitted. However, the built-up pyroelectric charge may be discharged or dissipated by connecting an electrical circuit to parts of the $LiTaO_3$ wafer, or by electrically shorting, shunting, or grounding the $LiTaO_3$ wafer with an external conductor. Discharging the built-up pyroelectric charge may relieve bowing or warping of the $LiTaO_3$ wafer.

A block 712, the joined and direct-bonded wafers are held at room temperature for at least 48 hours or more to allow bond strength to increase before elevating temperature in a subsequent annealing step. The bond strength increases with greater time at room temperature, as shown in FIG. 2.

At block 714, the joined and direct-bonded wafers are warmed and heated in an oven up to 50° C. to anneal, at a rate of temperature increase of about 1 degree ° C. per minute, or less. This relatively low-temperature anneal applied gradually avoids slippage of the direct-bonds and minimizes bowing and warpage.

Figure 8:
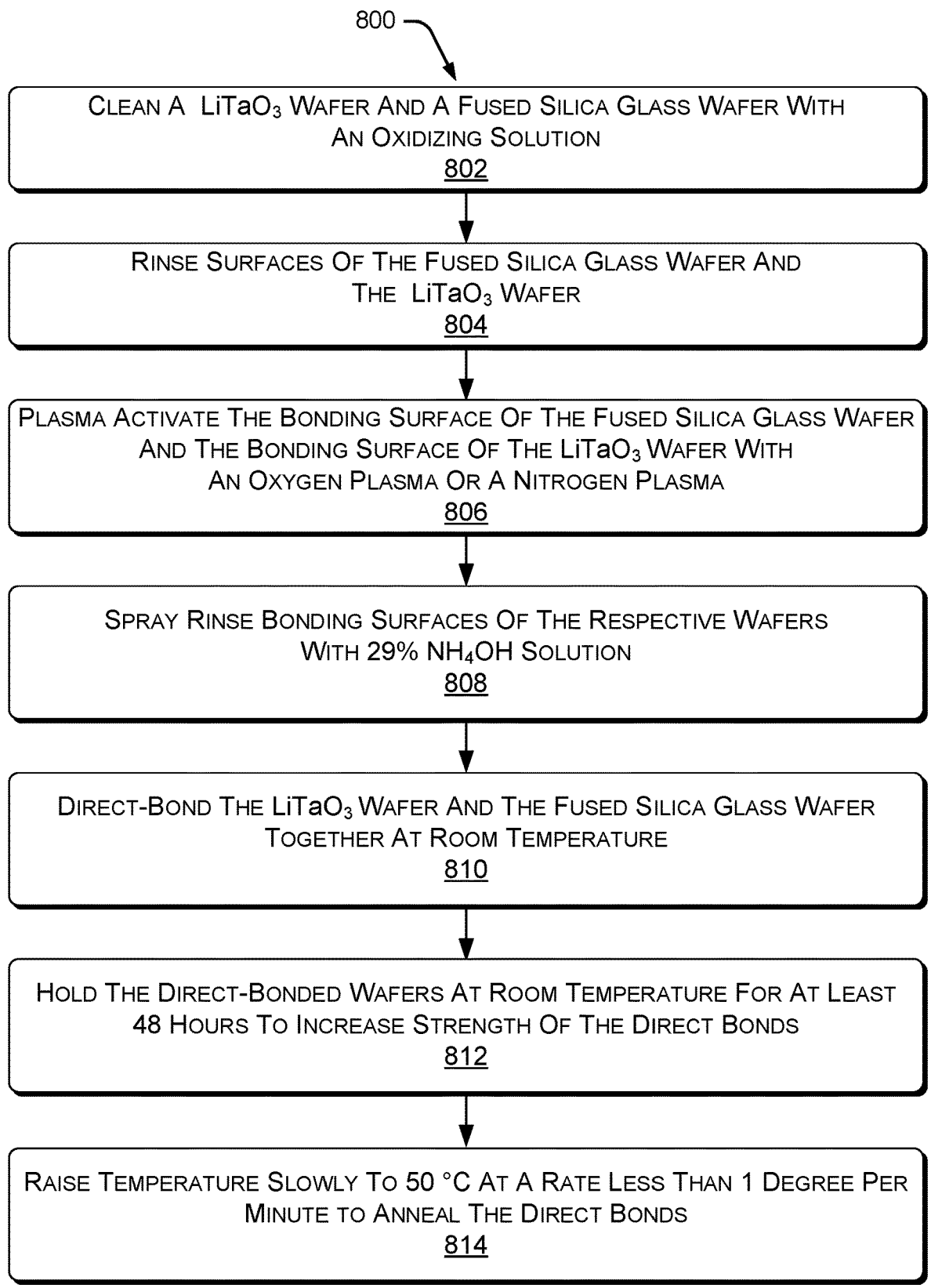
FIG. 8 is a flow diagram of an example process for direct-bonding $LiTaO_3$ with fused silica glass by creating a native oxide of the $LiTaO_3$ and/or the fused silica glass.

FIG. 8 shows a fourth example process 800, for direct-bonding a $LiTaO_3$ wafer at room temperature to a fused silica glass wafer without depositing a discrete layer of an oxide, carbide, nitride, carbonitride, or oxynitride material as a bonding intermediary. In the flow diagram of FIG. 8, operations of the example process 800 are shown in individual blocks.

At block 802, the $LiTaO_3$ wafer and a fused silica glass wafer are cleaned with a piranha solution of hydrogen peroxide and sulfuric acid ($H_2O_2:H_2SO_4$) in a ratio of 1:3, and then rinsed with water.

At block 804, the surfaces of the wafers are rinsed in a Megasonic deionized water process and can be spun and rinsed dry on a Goldfinger® processing tool, for example.

At block 806, the bonding surfaces of fused silica glass wafer and the $LiTaO_3$ wafer are plasma-activated with oxygen plasma or nitrogen plasma in RIE mode with a −200 to −300 volt bias.

At block 808, the bonding surfaces of the wafers are spray-rinsed with 29% $NH_4OH$ solution to remove particles and to enhance bond energy of direct-bonding. The wafers may be spun dry.

At block 810, the wafers are direct-bonded together at room temperature with the $LiTaO_3$ wafer loaded as the top wafer, for example. Infrared drying lamps are avoided to prevent excessive bowing and warpage. Room temperature direct-bonding is used to avoid excessive bowing of wafers. Heating during the spin drying would cause bowing of the $LiTaO_3$ wafer, and can be avoided. Built-up pyroelectric charge in the $LiTaO_3$ wafer may be discharged or dissipated by connecting an electrical circuit to parts of the $LiTaO_3$ wafer, or by electrically shorting, shunting, or grounding the $LiTaO_3$ wafer with an external conductor. Discharging the built-up pyroelectric charge may relieve a bowing tendency or warping of the $LiTaO_3$ wafer due to these effects.

A block 812, the joined and direct-bonded wafers are held at room temperature for at least 48 hours or more to allow bond strength to increase before elevating temperature in a subsequent annealing step. The bond strength increases with more time held at room temperature, as shown in FIG. 2.

At block 814, the joined and direct-bonded wafers are warmed and heated in an oven up to a temperature of 50° C. to anneal, at a rate of temperature increase of about 1 degree ° C. per minute, or less. This relatively low-temperature anneal applied slowly avoids slippage of the direct-bonds and minimizes bowing and warping.

To further refine the example direct-bonding processes at room temperature that use no discrete deposited layer of oxide, carbide, nitride, carbonitride, or oxynitride material, an oxygen plasma activation can sometimes yield higher bond strength than nitrogen plasma activation, particularly when bonding $LiTaO_3$ to sapphire. However, nitrogen plasma activation may work better for bonding $LiTaO_3$ to silicon without the discrete deposited oxide layer intermediary between wafers.

Annealing of direct-bonds between $LiTaO_3$ and silicon may attain higher bond strength with higher temperature. Nominally, direct-bonded wafers that have cured at room temperature for up to 48 hours are heated to 50° C. in an oven at rate of temperature increase than is about 1 degree ° C. per minute, or less. In the case of forming a native oxide, nitride, carbide, carbonitride, oxynitride, on one or both bonding surfaces as an intermediary for direct-bonding the dissimilar materials, after the annealing step at a gradual temperature increase up to 50° C., the temperature of the joined wafers can be further ramped up to 100° C. at a rate of temperature increase that is about 1 degree ° C. per minute or less to increase the bond strength even further, without significant increase in bowing or warping of the wafers, as shown in FIG. 9.

Both the example processes that deposit a discrete thin oxide, carbide, nitride layer, carbonitride, and/or oxynitride on one or both wafers as an intermediary for direct-bonding between dissimilar materials of the respective wafers at room temperature, and on the other hand, the example processes that form a native oxide (or carbide, nitride, carbonitride, or oxynitride) on one or both surfaces of the wafers by oxidizing native materials of a first wafer and/or second wafer can direct-bond diverse materials together at room temperature. Curing at room temperature for up to 48 hours or even beyond greatly strengthens the direct bonds formed in either case.

The materials of the first wafer and second wafer to be direct-bonded together at room temperature may have significantly different CTEs and lattice constants. The dissimilar materials to be used in a given microelectronic device constructed by the example processes described herein may be managed with thin film engineering principles for balancing wafer warpage of the two wafers, due to the difference in the materials used. Likewise, different thicknesses of the different materials of the two wafers can be leveraged for the two wafers of different thicknesses of the different materials to cancel out each other's bowing and warping. In an implementation, for the materials discussed herein, the bowing or warpage in general is assumed or calculated to be in the range of 25 μm per inch of diameter down to 10 μm per inch of diameter.

The example processes described above can be used to make stacks of wafers of different materials for a microelectronic device or package. The various stack layers can also be used to make multiple stacks of integrated circuits combined with other optical and acoustic devices, with or without direct-bonding between all the layers present.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. Moreover, the description of the techniques and devices with regard to wafers could be employed in D2D, D2W, or W2W applications. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A process for direct-bonding dissimilar materials in microelectronics, comprising:
    obtaining a first substrate comprising a first material having a first crystal lattice with a first set of physical dimensions of first unit cells, the first material possessing a first coefficient of thermal expansion (CTE);
    obtaining a second substrate comprising a second material having a second crystal lattice with a second set of physical dimensions of second unit cells, the second material possessing a second CTE, wherein the second CTE is different from the first CTE of the first material;
    depositing a thin amorphous layer, the thin amorphous layer comprising an oxide, a carbide, a nitride, a carbonitride, or an oxynitride, on a surface of the first substrate and depositing another thin amorphous layer on the second substrate, wherein each of the thin amorphous layers is a direct-bonding intermediary between the first substrate and the second substrate, each of the thin amorphous layers having a thickness between approximately 100 nm and approximately 1000 nm; and
    direct-bonding the first substrate and the second substrate together at an ambient room temperature to make a joined stack.

2. The process of claim 1, further comprising maintaining the joined stack at the ambient room temperature for at least 48 hours.

3. The process of claim 1, further comprising:
    prior to the direct-bonding of the first wafer and the second wafer together, plasma activating the bonding surfaces of the first wafer and the second wafer; and
    exposing the plasma-activated bonding surfaces to NH$_4$OH (ammonium hydroxide).

4. The process of claim 1, further comprising:
    prior to the direct-bonding of the first wafer and the second wafer together, plasma activating the bonding surfaces of the first wafer and the second wafer; and
    exposing the plasma-activated bonding surfaces to deionized water.

5. The process of claim 1, further comprising raising the temperature of the joined stack from 50° C. to 100° C. at a rate of temperature increase about 1 degree per minute or less.

6. The process of claim 1, wherein the first material of the first substrate comprises lithium tantalate (LiTaO$_3$) or lithium niobate (LiNbO$_3$), and the second material of the second substrate comprises silicon (Si), quartz, fused silica glass, sapphire, or a glass.

7. The process of claim 1, further comprising:
    planarizing a bonding surface of each of the first substrate and the second substrate with chemical mechanical planarization (CMP) before the direct-bonding at the ambient room temperature;
    cleaning the planarized surfaces with a PVA brush scrubbing process and a deionized water rinse process;
    further cleaning the planarized surfaces with a Megasonic SC1 process and rinsing with deionized water; and
    spin drying the cleaned surfaces.

8. The process of claim 7, further comprising plasma activating the cleaned surfaces with nitrogen plasma in RIE mode with a bias voltage of −200 to −300 volts.

9. The process of claim 8, further comprising spray rinsing the plasma-activated surfaces with a 29% NH$_4$OH solution to fortify subsequent direct bonds.

10. The process of claim 1, wherein the first material of the first substrate forms a device when direct-bonded to the second material of the second substrate, the device selected from the group consisting of an acoustic filter, a surface acoustic wave (SAW) device, a sensor on a processor, a light emitting diode (LED), an infrared (IR) sensor, a VIS sensor, a projector on a processor, an image sensor, an optical device, and a light detection and ranging (LIDAR) device.

11. The process of claim 1, wherein the thin amorphous layer comprises silicon.

12. The process of claim 1, wherein the first set of physical dimensions of first unit cells is different than the second set of physical dimensions of second unit cells.

13. A process for direct-bonding dissimilar materials in microelectronics, comprising:
- obtaining a first substrate comprising a first material having a first crystal lattice with a first set of physical dimensions of first unit cells, the first material possessing a first coefficient of thermal expansion (CTE);
- obtaining a second substrate comprising a second material having a second crystal lattice with a second set of physical dimensions of second unit cells, the second material possessing a second CTE, wherein the second CTE is different from the first CTE of the first material;
- depositing a thin amorphous layer, the thin amorphous layer comprising an oxide, a carbide, a nitride, a carbonitride, or an oxynitride, on a surface of the first substrate and depositing another thin amorphous layer on the second substrate, wherein each of the thin amorphous layers is a direct-bonding intermediary between the first substrate and the second substrate, each of the thin amorphous layers having a thickness between approximately 100 nm and approximately 1000 nm;
- direct-bonding the first substrate and the second substrate together at an ambient room temperature to make a joined stack; and
- raising the temperature of the joined stack to around 50° C. at a rate of about 1° C. per minute or less.

14. The process of claim 13, further comprising raising the temperature of the joined stack to around 100° C. at a rate of about 1° C. per minute or less, when one of the materials is silicon.

15. The process of claim 13, further comprising plasma activating the first substrate with nitrogen plasma in RIE mode with a bias voltage of −200 to −300 volts and plasma activating the second substrate with oxygen plasma in RIE mode with a bias voltage of −200 to −300 volts.

16. The process of claim 13, wherein the first set of physical dimensions of first unit cells is different than the second set of physical dimensions of second unit cells.

17. A process for direct-bonding dissimilar materials in microelectronics, comprising:
- obtaining a first substrate comprising a first material having a first crystal lattice with a first set of physical dimensions of first unit cells, the first material possessing a first coefficient of thermal expansion (CTE);
- obtaining a second substrate comprising a second material having a second crystal lattice with a second set of physical dimensions of second unit cells, the second material possessing a second CTE, wherein the second CTE is different from the first CTE of the first material;
- depositing a thin amorphous layer, the thin amorphous layer comprising an oxide, a carbide, a nitride, a carbonitride, or an oxynitride, on a surface of the first substrate and depositing another thin amorphous layer on the second substrate, wherein each of the thin amorphous layers is a direct-bonding intermediary between the first substrate and the second substrate, each of the thin amorphous layers having a thickness between approximately 100 nm and approximately 1000 nm;
- direct-bonding the first substrate and the second substrate together at an ambient room temperature to make a joined stack; and
- maintaining the joined stack at the ambient room temperature for at least approximately 48 hours and then raising the temperature of the joined stack to around 50° C. at a rate of about 1° C. temperature increase per minute, or less.

18. The process of claim 17, wherein the first material of the first substrate comprises lithium tantalate ($LiTaO_3$) or lithium niobate ($LiNbO_3$), and the second material of the second substrate comprises silicon (Si), quartz, fused silica glass, sapphire, or a glass.

19. The process of claim 17, wherein the first set of physical dimensions of first unit cells is different than the second set of physical dimensions of second unit cells.

* * * * *